(12) United States Patent
Yoon et al.

(10) Patent No.: US 7,723,702 B2
(45) Date of Patent: May 25, 2010

(54) E-BEAM LITHOGRAPHY SYSTEM FOR SYNCHRONOUSLY IRRADIATING A PLURALITY OF PHOTOMASKS AND METHOD OF FABRICATING PHOTOMASKS USING THE SAME

(75) Inventors: Je-bum Yoon, Hwaseong-si (KR); Cha-won Koh, Yongin-si (KR); Myoung-ho Jung, Suwon-si (KR); Gi-sung Yeo, Seoul (KR); Sang-jin Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 551 days.

(21) Appl. No.: 11/656,467

(22) Filed: Jan. 23, 2007

(65) Prior Publication Data

US 2007/0181828 A1 Aug. 9, 2007

(30) Foreign Application Priority Data

Feb. 3, 2006 (KR) ...................... 10-2006-0010714

(51) Int. Cl.
*G21G 5/00* (2006.01)
(52) U.S. Cl. ............ 250/491.1; 250/492.2; 250/492.22; 250/492.3; 250/252.1
(58) Field of Classification Search .............. 250/492.1, 250/492.2, 492.22, 492.3, 491.1, 252.1; 356/342, 356/622
See application file for complete search history.

(56) References Cited

U.S. PATENT DOCUMENTS

| 6,038,074 A | * | 3/2000 | Kitaguchi et al. ............ 359/618 |
| 2004/0056210 A1 | * | 3/2004 | Scherer ................... 250/492.1 |
| 2005/0199807 A1 | * | 9/2005 | Watanabe et al. ........... 250/306 |

FOREIGN PATENT DOCUMENTS

| JP | 11-329928 | 11/1999 |
| JP | 2001-144008 | 5/2001 |
| KR | 1020040019511 A | 3/2004 |
| WO | WO 2005022581 A2 * | 3/2005 |

* cited by examiner

*Primary Examiner*—Jack I Berman
*Assistant Examiner*—Hanway Chang
(74) *Attorney, Agent, or Firm*—Harness, Dickey & Pierce, P.L.C.

(57) ABSTRACT

Disclosed is an E-beam lithography system for synchronously irradiating surfaces of a plurality of substrates. The E-beam lithography system may include a loading unit loading and unloading substrates, an alignment chamber aligning the substrates, a transfer chamber transferring the substrates from the loading unit or chambers, a lithography chamber radiating one or more electron beams onto the substrates, and a vacuum chamber creating a vacuum in the chambers. A stage may be installed in the lithography chamber such that the substrates may be mounted on the stage and radiated with one or more electron beams.

13 Claims, 11 Drawing Sheets

E-BEAM LITHOGRAPHY SYSTEM FOR SYNCHRONOUSLY IRRADIATING A PLURALITY OF PHOTOMASKS AND METHOD OF FABRICATING PHOTOMASKS USING THE SAME

PRIORITY STATEMENT

This application claims the benefit of priority from Korean Patent Application No. 10-2006-0010714 filed on Feb. 3, 2006 in the Korean Intellectual Property Office, the entire contents of which is incorporated herein by reference.

BACKGROUND

1. Field of the Invention

Example embodiments relate to an E-beam lithography system and, more particularly, to an E-beam lithography system that may synchronously irradiate surfaces of a plurality of photomasks.

2. Description of the Related Art

As semiconductor technology continues to develop, advancements in semiconductor devices, especially memory devices, are improving. That is, high speed, low power consumption, high capacity, miniaturized memory devices are being developed. As semiconductor memory devices are improved, technologies for improving integration are becoming even more important.

Improving the integration of semiconductor devices is being achieved through the development of new and/or improved circuit design techniques, materials, and various process techniques. Patterning techniques are important in improving the integration of semiconductor devices. Through the patterning technique, the pattern of unit devices, such as transistors, for example, may be finely formed on a wafer.

Patterning techniques generally include a photolithography technique and an etching technique. The photolithography technique may include fabricating a photomask and transferring a pattern to a wafer using the photomask. A photomask fabricating technique refers to a technique for forming a pattern to be transferred to a wafer on a photomask. If a pattern is formed on the photomask, the pattern should be formed to have the correct shape and a uniform size. Further, the substrate and the pattern should not have defects. The substrate may be a glass substrate, for example. Another important consideration is that an ideal layer-to-layer overlay alignment tolerance of the photomasks should be zero.

If a semiconductor chip is produced on a wafer, various patterns and unit devices may be formed using several photomasks. As a result, a finished semiconductor chip may operate correctly only if the patterns formed on the wafer using the several photomasks are precisely aligned. If even one layer is placed incorrectly and/or is misaligned, a finished unit device may not function properly, which may cause the finished semiconductor including the unit device to be inoperable and/or malfunction. Therefore, it is important for photomasks used in fabricating a semiconductor chip to have precise layer-to-layer overlay alignment.

Further, in the case of a fine pattern, duplicate exposure may be performed on a wafer using a plurality of photomasks to form one layer of a pattern, thereby further increasing the importance of layer-to-layer overlay alignment of photomasks.

In order to align the patterns formed on the photomasks, factors including registration and orthogonality may be used.

Registration refers to an alignment factor indicating how precisely the pitch, size, and interval of the patterns in the X and/or Y direction match ideal and/or computer data.

Orthogonality refers to the angles of the X and/or Y directions of the patterns. Various patterns may have several shapes created by combining lines in the X-direction and lines in the Y-direction and/or patterns in the X-direction and patterns in the Y-direction. As such, orthogonality refers to a measure representing whether the lines in the X-direction are precisely perpendicular to the lines in the Y-direction and/or whether the patterns in the X-direction are precisely perpendicular to the patterns in the Y-direction.

Herein, registration and orthogonality are referred to generically as pattern alignment. If the photomasks are overlaid, the factor representing whether the pattern alignments match each other is referred to as layer-to-layer overlay alignment and is abbreviated herein as overlay alignment.

FIGS. 1A to 1D are views schematically illustrating pattern alignment and/or computer data of two photomasks, which may be fabricated using an E-beam lithography system. FIGS. 1A to 1D are used to further describe and illustrate examples of what is referred to herein as "pattern alignment" and a "difference in pattern alignment". The drawings are somewhat exaggerated for ease of explanation. A photomask (a) and a photomask (b) may be photomasks that are separately fabricated and have the same pattern. Alternatively, the photomasks may be photomasks which are fabricated to be overlaid. Each of the photomasks may be individually fabricated.

Figure 1A:
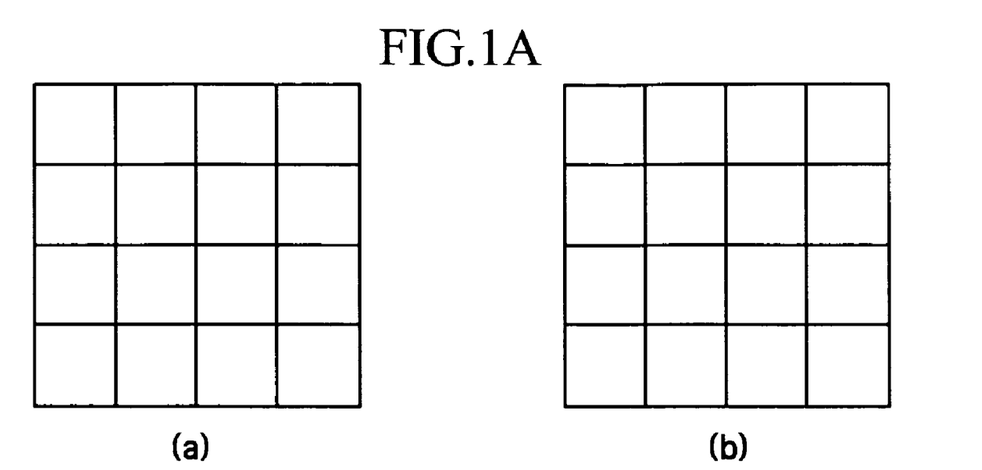
FIGS. 1A to 1D are views illustrating pattern alignment and layer-to-layer alignment.

FIG. 1A is an example view showing ideal pattern alignment, which may be computer data about patterns to be formed on photomasks.

The pattern of the photomask (a) and the pattern of the photomask (b) have an ideal pattern alignment in the X and Y directions meaning there is no error. Hence, if the two patterns shown in FIG. 1A are overlaid, the patterns of the photomask (a) and the pattern of the photomask (b) correspond. However, because the photomasks shown in FIG. 1A represent ideal pattern alignment, photomasks having the pattern alignment shown in FIG. 1A are seldom realizable.

Figure 1B:
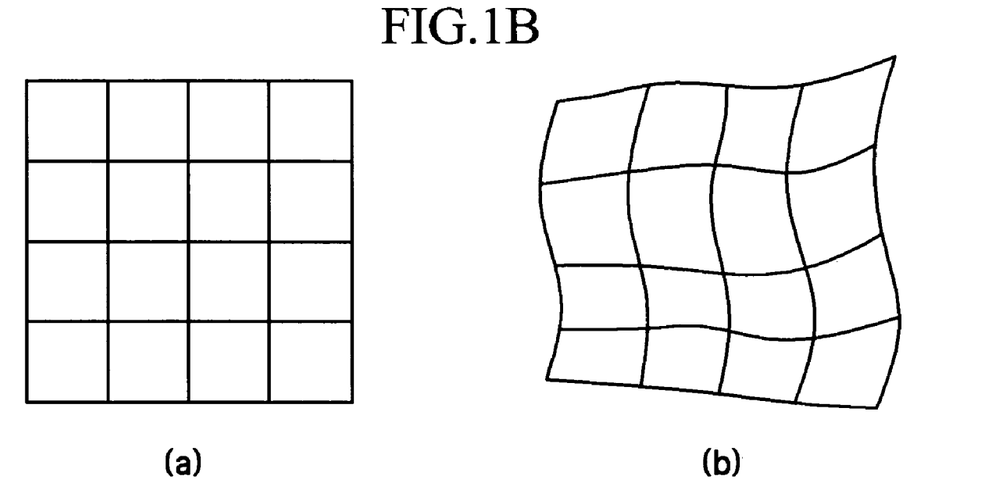

FIG. 1B is a view comparing an example photomask (a) having ideal pattern alignment with an example photomask (b) having a difference in pattern alignment.

In FIG. 1B, the photomask (a) has ideal pattern alignment corresponding to computer data, and the photomask (b) has pattern alignment in which the registration and orthogonality are slightly different from the computer data Thus, the photomasks shown in FIG. 1B may not precisely overlay each other.

If a pattern is formed using the photomasks shown in FIG. 1B, the pattern formed by the photomask (a) would not be precisely overlaid on the pattern formed by the photomask (b) and thus, a unit device would likely not be correctly produced. Thus, a finished semiconductor device including the unit device may be inoperable. Even if the finished semiconductor device including the unit device operates, the finished semiconductor device would likely have low reliability and/or durability.

Figure 1C:
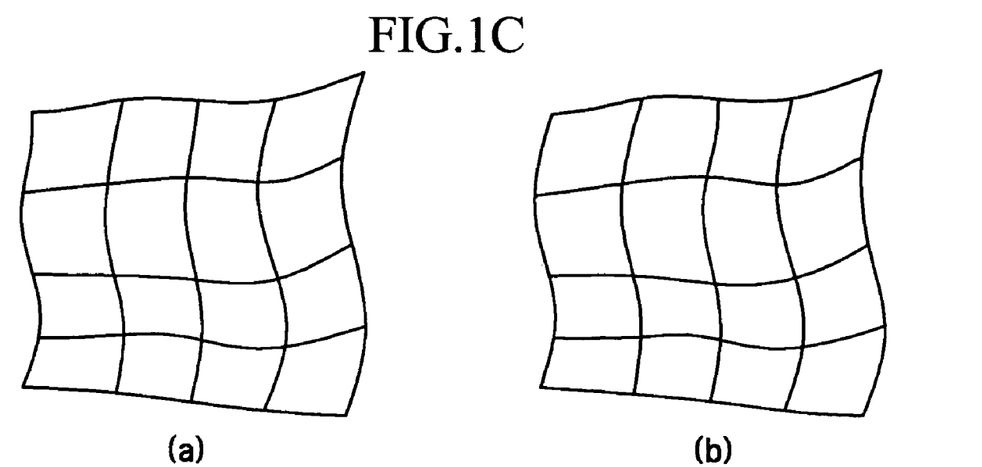

FIG. 1C is a view comparing pattern alignment of example photomasks having the same degree of difference.

In FIG. 1C, both the photomask (a) and the photomask (b) have the same pattern alignment. If the photomasks are overlaid, the patterns formed from the photomasks may precisely correspond to each other. Thus, a semiconductor device fabricated using the photomasks of FIG. 1C may operate correctly. However, it is nearly impossible to fabricate the photomasks such that the photomasks have the same degree of difference using conventional techniques.

Figure 1D:
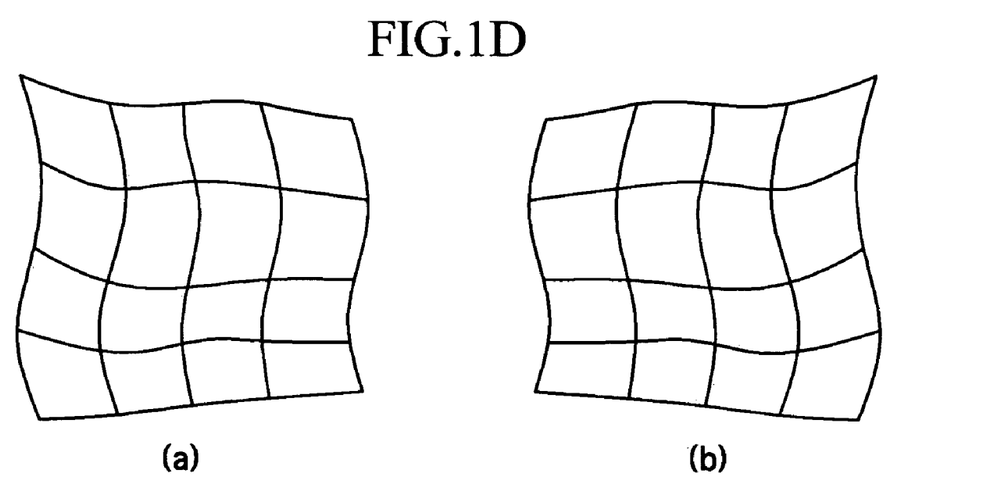

FIG. 1D is a view illustrating two example photomasks having different degrees of difference in pattern alignment. FIG. 1D illustrates a typical example of two photomasks formed using conventional techniques.

The photomask (a) and the photomask (b) illustrated in FIG. 1D have different pattern alignment. If a semiconductor device is fabricated using the photomasks, the pattern of an upper layer is not precisely overlaid on the pattern of a lower layer. As a result finished unit devices formed using the photomask (a) and the photomask (b) shown in FIG. 1D and a semiconductor device including the unit devices may malfunction and/or be inoperable.

For example, assuming that the photomask (a) is a line pattern and the photomask (b) is a via hole pattern, lines and via holes would likely not overlay each other if the example photomasks illustrated in FIGS. 1B and 1D were used and thus, an electric connection would likely not be created. Thus, the formed unit devices may be inoperable. If an electric connection is somewhat achieved using the example photomasks illustrated in FIGS. 1B and 1D, the lines and the via holes are likely only partially overlaid and thus, an electric resistance of the unit devices formed using the example photomasks illustrated in FIGS. 1B and 1D would likely be undesirably large. In this case, the unit devices may not operate smoothly. Accordingly, the reliability and the durability of a finished semiconductor device including these unit devices would decrease.

Further, if the example photomasks illustrated in FIG. 1D are overlaid on the example photomasks having ideal pattern alignment illustrated in FIG. 1A, a normal device may be formed. However, in this case, if the example photomasks have different pattern alignment, overlay alignment tolerance may increase. For example, the overlay alignment tolerance may be twice as much as that of the pattern alignment.

Thus, reducing and/or minimizing the overlay alignment tolerance of photomasks is generally more important than reducing and/or minimizing the pattern alignment tolerance photomasks.

Pattern alignment tolerance and overlay alignment tolerance may result from the motion error of a stage of conventional photomask fabricating equipment, which may move photomasks forwards, backwards, left, and right.

A conventional E-beam lithography system for fabricating photomasks may be operated such that an irradiating system radiating an electron beam irradiates a desired and/or predetermined position; and a stage on which photomasks is mounted moves forwards, backwards, left, and right, thus radiating the electron beam on the surfaces of the photomasks to form patterns. Conventionally, the precision of the mechanical movement of the stage determines the pattern alignment and the overlay alignment.

Using conventional devices and/or techniques, it is difficult to reduce and/or solve pattern misalignment issues, which refer to the overlay alignment tolerance of photomasks or overlaid photomasks.

The pattern alignment tolerance and the overlay alignment tolerance generally do not depend on the size of a pattern to be formed, but instead have a predetermined mechanical limit. Therefore, assuming that the pattern alignment tolerance for the design rule of a pattern is the tolerance rate of the photomask, the smaller the pattern to be formed, the larger the relative tolerance of the pattern alignment and/or the overlay alignment.

As described above, the relative tolerance of the pattern alignment and/or the overlay alignment affects the manufacturing process and circuit design, so that a circuit must be designed in consideration of the pattern alignment tolerance and/or the overlay alignment tolerance. When considering the pattern alignment tolerance and/or the overlay alignment tolerance, the size of each pattern is set to be larger than an ideal size, so that the margin for the process is relatively large. This is a major factor impeding the tendency toward the miniaturization of semiconductor devices.

SUMMARY

Example embodiments provide an E-beam lithography system. The E-beam lithography system may include a loading unit for loading/unloading substrates, an alignment chamber in which substrates are aligned, and a lithography chamber including a stage where more than one of the substrates are mounted and irradiated with at least one electron beam. The E-beam lithography system may also include a vacuum chamber creating a vacuum in the chambers and a transfer chamber for transferring the substrates from the loading unit or the chambers.

According to an example embodiment, the stage may include an E-beam measuring unit for adjusting the electron beam and aligning the stage. The E-beam measuring unit may include a focus measuring portion, a level measuring portion, and a position measuring portion. The focus measuring portion may have multiple levels and/or a shape of multilayered stairs. The level measuring portion may have a shape of a polygon which is convex at an upper part thereof or of a hemisphere. The position measuring portion may have a shape of a polygon having a protruding portion or a cross shape.

According to an example embodiment, the E-beam measuring unit may be located at a center of the stage.

According to an example embodiment, the stage may include a first direction stage moving portion moving the stage in a first direction and a second direction stage moving portion moving the stage in a second direction. The stage may also include a first direction stage guide and a second direction stage guide. Still further, the stage may include a first direction laser mirror and a second direction laser mirror.

According to an example embodiment, a plurality of irradiating systems may be provided in the lithography chamber. Each of the irradiating systems may include an electron gun, an electron lens, and at least one aperture. The at least one aperture may include at least one of a variable rectangular aperture or a circular aperture. The irradiating systems may share one E-beam control system controlling density, current, voltage and energy of the electron beam.

According to an example embodiment, the alignment chamber may include a cassette aligning a plurality of substrates. Each of the substrates may be a photomask or a reticle.

An example embodiment provides an E-beam lithography method. The E-beam lithography method may include loading substrates onto a loading unit of an E-beam lithography system, transferring the loaded substrates into a vacuum chamber, transferring the substrates fed into the vacuum chamber into an alignment chamber, aligning the substrates in the alignment chamber, transferring the aligned substrates into a lithography chamber and mounting the substrates on a stage provided in the lithography chamber, controlling a plurality of irradiating systems radiating an electron beam onto the substrates mounted on the stage, using a common E-beam control system, driving the stage and simultaneously radiating the electron beam onto the substrates, and transferring the substrates into the loading unit, after the electron beam has been radiated onto the substrates.

According to an example embodiment, controlling the electron beam controls density, speed, size, and energy of the electron beam in the E-beam control system using an E-beam control unit provided on the stage.

According to an example embodiment, radiating the electron beam while driving the stage includes and repeats moving the stage in a first X direction while fixing the stage in a Y direction and radiating the electron beam, moving the stage in the Y direction while fixing the stage in the first X direction, moving the stage in a second X direction while fixing the stage in the Y direction and radiating the electron beam, and moving the stage in the Y direction while fixing the stage in the second X direction. The first X direction and the second X direction may be opposite directions along an X-axis.

Moving the stage in the first X direction and moving the stage in the second X may continuously perform a plurality of unit lithography methods.

An example embodiment of the present invention provides an E-beam lithography method. The E-beam lithography method may include transferring substrates into an alignment chamber, aligning the substrates in the alignment chamber; transferring the aligned substrates into a lithography chamber, mounting more than one of the substrates on a stage provided in the lithography chamber; and radiating at least one electron beam onto the substrates mounted on the stage.

BRIEF DESCRIPTION OF THE DRAWINGS

The above and other objects, features and advantages of the present invention will be more clearly understood from the following detailed description taken in conjunction with the accompanying drawings, in which:

FIGS. 6A to 8B are views illustrating an example embodiment of an E-beam lithography system using an E-beam measuring unit to adjust an electron beam and a stage.

DETAILED DESCRIPTION OF EXAMPLE EMBODIMENTS

Example embodiments are described more fully hereinafter with reference to the accompanying drawings. The example embodiments may, however, be embodied in many different forms and should not be construed as limited to the example embodiments set forth herein. Rather, these example embodiments are provided so that this disclosure will be thorough and complete. Like reference numerals refer to like elements throughout. The size or relative size of layers or areas is somewhat exaggerated in the drawings for clarity of the description.

It will be understood that when an element is referred to as being "on" another element, it can be directly on the other element or intervening elements may be present. In contrast, when an element is referred to as being "directly on" another element, there are no intervening elements present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to other elements as illustrated in the figures. It will be understood that relative terms are intended to encompass different orientations of the device in addition to the orientation depicted in the figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the example embodiments belong. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The example embodiments are described herein with reference to idealized schematic views shown in the drawings and thus, the illustrated views may change in response to manufacturing technology and/or tolerance. That is, example embodiments are not limited to the specific shape shown in the drawings, but instead include a shape varying according to the manufacturing process. Therefore, the areas illustrated in the drawings have schematic characteristics, and the shape of the areas shown in the drawings is for illustrative purposes only, but does not limit the scope of example embodiments.

Herein, a photomask refers to an article transferring a pattern to a wafer using light. The photomask may include a photomask, a reticle, a reflective photomask, and/or a photo mirror, for example.

Hereinafter, example embodiments of an E-beam lithography system are described in detail with reference to the accompanying drawings.

Figure 2:
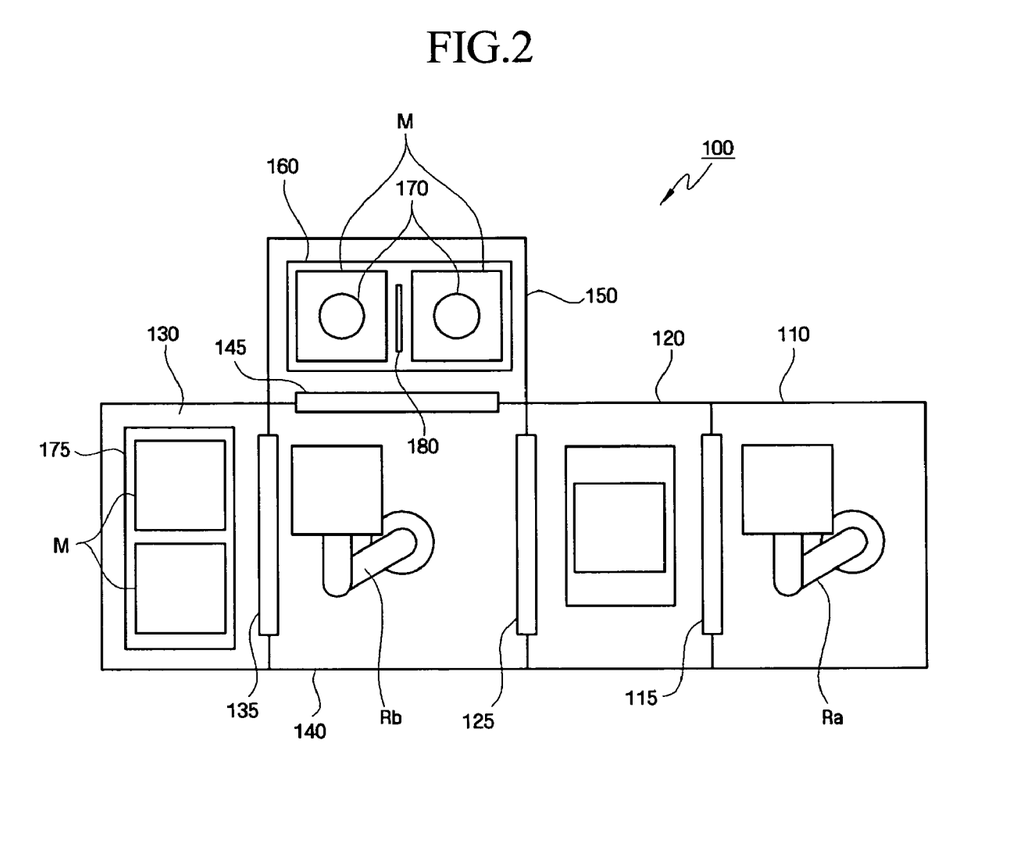
FIG. 2 is a plan view schematically showing an example embodiment of an E-beam lithography system.

FIG. 2 is a plan view schematically showing an example embodiment of an E-beam lithography system 100.

As shown in FIG. 2, the E-beam lithography system 100 may include a loading unit 110, a transfer chamber 140, an alignment chamber 130, an E-beam lithography chamber 150, a stage 160, a plurality of irradiating systems 170, and a vacuum chamber 120. The loading unit 110 may include a first robot arm Ra to load/unload photomasks M and to transfer the photomasks M, for example. The transfer chamber 140 may include a second robot arm Rb to transfer the photomasks M from the loading unit 110 and/or chambers. The alignment chamber 130 may be provided with a cassette 175 on which the photomasks M may be mounted. The alignment chamber may be used to align the photomasks M. The E-beam lithography chamber 150 may be used to radiate an electron beam onto the one or more surfaces of the photomasks M. The stage 160 may be used substantially, simultaneously mount a plurality of photomasks M in the E-beam lithography chamber 150. A plurality of irradiating systems 170 may radiate electron beams onto the plurality of photomasks M. The vacuum chamber 120 may create a vacuum in the chambers 120, 130, 140, and 150.

Doors 115, 125, 135, and 145 may be provided between the chambers 120, 130, 140, and 150.

The stage 160 may include an E-beam measuring unit 180 to adjust an electron beam and to align the stage 160. The E-beam measuring unit 180 may be located at the center of the stage 160, for example, and may include a focus measuring part 180a, a level measuring part 180b and a position measuring part 180c. The focus measuring part 180a may have a shape including multilayered stages. The level measuring part 180b may have a shape of a polygon, which is convex at its upper portion, or a hemi-spherical shape, for example. The position measuring part 180c may have the shape of a polygon having a protruding portion or a cross shape, for example. The E-beam measuring unit 180 is described later in more detail with reference to FIGS. 6A-8B.

The stage 160 may also include a Y-direction stage 161, which moves in the Y direction; an X-direction stage 162, which is provided on the Y-direction stage 161 and moves in the X direction; and bases 163, which are provided on the X-direction stage 162. The photomasks M or the cassette 175 may be mounted on the bases 163, for example. The stage 160 is described later in more detail with reference to FIG. 3.

The irradiating systems 170 may include electron guns for discharging electrons, a plurality of electron lenses for guiding the electrons discharged from the electron guns in one direction, and apertures for adjusting electron beams. The interior of each irradiating system 170 and each aperture is described later in more detail with reference to FIGS. 4A-5B.

The irradiating systems 170 may share one E-beam control system (not shown). The E-beam control system may control the conditions under which the irradiating systems 170 radiate electron beams. Particularly, voltage, current, amount of electrons, drift, energy, etc., may be controlled by the E-beam control system. Because the irradiating systems 170 may share one E-beam control system, the irradiating systems 170 may be controlled to share the same conditions, which may be relatively low in tolerance.

The first and second robot arms Ra and Rb may transfer a plurality of photomasks and/or the cassette 175 on which the photomasks are mounted.

The cassette 175 may mount and align a plurality of photomasks M substantially simultaneously.

Figure 3:
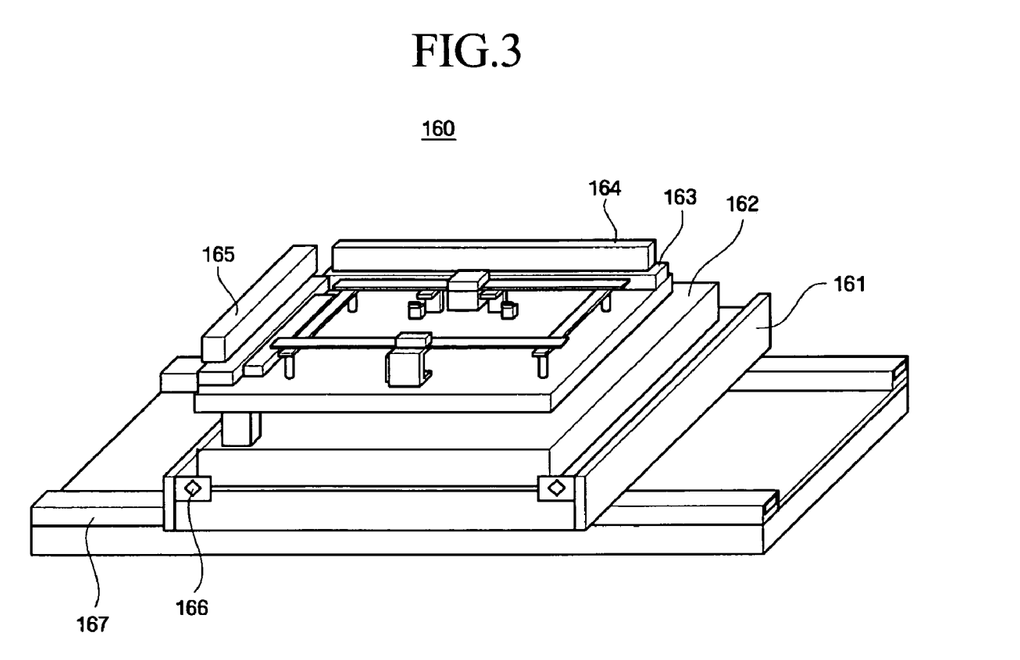
FIG. 3 is a perspective view schematically showing an example stage of an example embodiment of an E-beam lithography system.

FIG. 3 is a perspective view schematically showing an example stage 160 of an example embodiment of an E-beam lithography system 100.

Referring to FIG. 3, the stage 160 of the E-beam lithography system 100 may include the Y-direction stage 161, which moves in the Y direction; the X-direction stage 162, which is provided on the Y-direction stage 161 and moves in the X direction; and the bases 163, which are provided on the X-direction stage 162. The photomasks M and/or the cassette 175 may be mounted on the bases 163.

The stage 160 may be mechanically controlled by a stage controller (not shown) and/or a stage drive system (not shown), based on an electric signal provided by a processor of the E-beam lithography system 100.

The X-direction stage 162 may include X-direction stage guides 166 and an X-direction laser mirror 164. Likewise, the Y-direction stage 161 may include Y-direction stage guides 167 and a Y-direction laser mirror 165. The Y-direction stage 161 may move along the Y-direction stage guides 167, and the X-direction stage 162 may move along the X-direction stage guides 166.

The bases 163 may include the X-direction laser mirror 164, which detects the movement of the stage in the X direction, and the Y-direction laser mirror 165, which detects the movement of the stage in the Y direction. Each base 163 may include a ground portion that contacts a conductor transmitting an electric signal to the surfaces of the photomasks M mounted on the base and discharges static electricity. The X direction and the Y direction are not absolute directions. That is, the X direction and the Y direction may be exchanged with each other. Further, the position of the stage may be changed in various example embodiments.

Figure 4A:
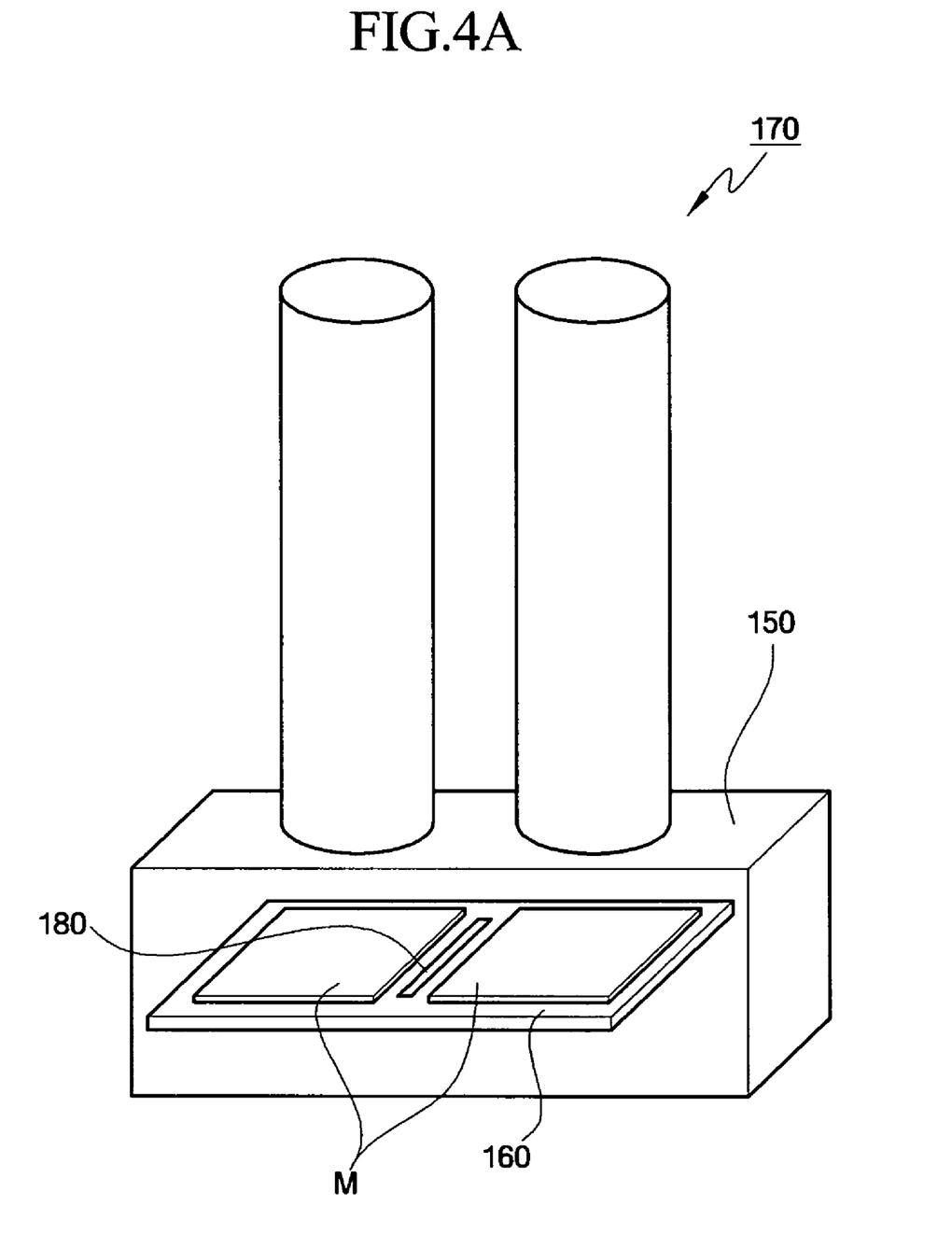
FIGS. 4A and 4B are perspective views schematically showing a lithography chamber and an irradiating system of an example embodiment of an E-beam lithography system.
Figure 4B:
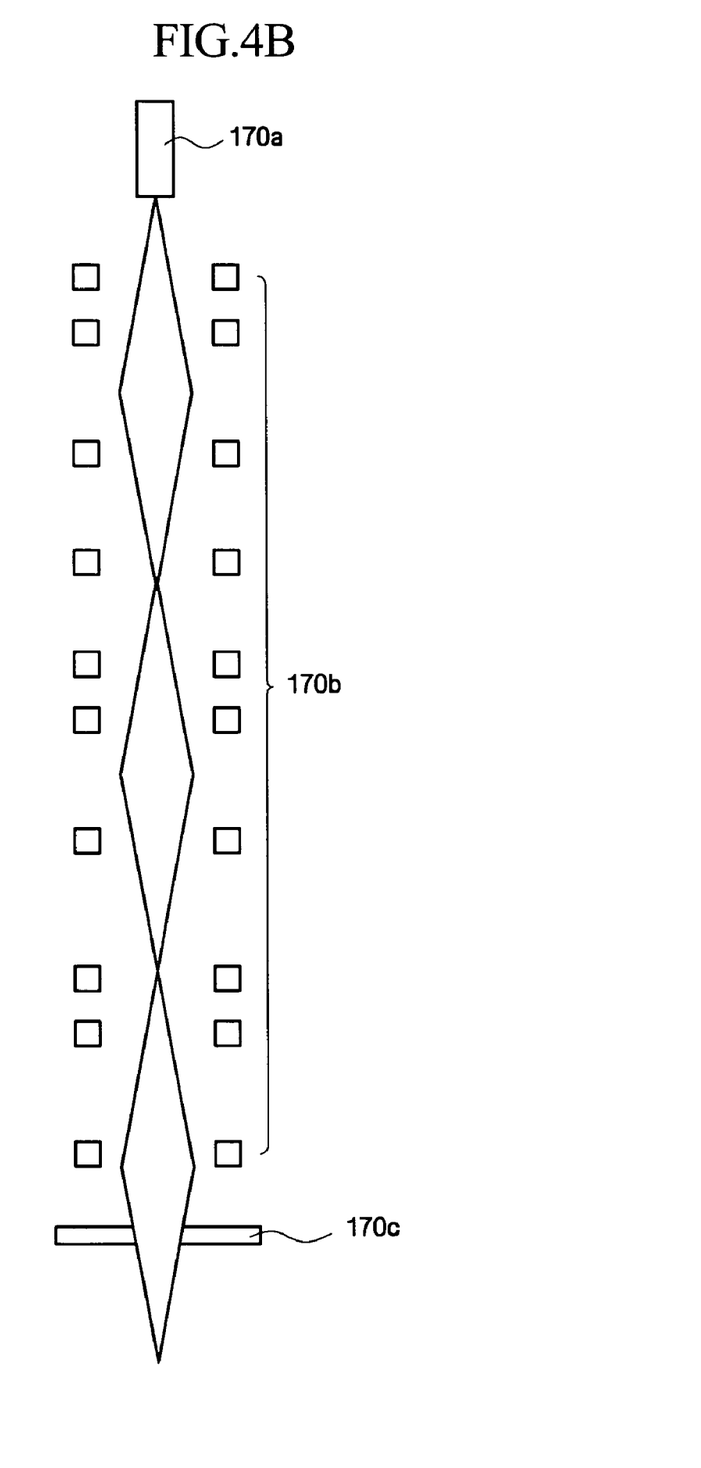

FIGS. 4A and 4B are perspective views schematically showing the lithography chamber 150 and the irradiating systems 170 of an example embodiment of an E-beam lithography system 100.

Referring to FIG. 4A, the irradiating systems 170 may radiate electron beams onto the one or more surfaces of the photomasks M mounted on the stage 160, which may be provided in the lithography chamber 150. As shown in FIG. 4A, the E-beam measuring unit 180 may be provided at the center of the stage 160. While a plurality of photomasks M (e.g., the two photomasks illustrated in FIGS. 2 and 4A) is mounted on the stage 160, the stage may move forward, backward, left, and right. The irradiating systems 170 may be individually moved. However, while the irradiating systems 170 radiate electron beams, the position of each of the irradiating systems 170 may be fixed.

FIG. 4B is a cutaway view schematically showing an example interior of each of the irradiating systems 170.

Referring to FIG. 4B, each of the irradiating systems 170 of an example embodiment of an E-beam lithography system 100 may include an electron gun 170a, electron lenses 170b, and an aperture 170c. The electron gun 170a may discharge electrons. The electron lenses 170b may guide the discharged electrons, and the aperture 170c may adjust the size of an electron beam. The electron gun 170a may be subjected to electric energy and may discharge electrons through heat release or field emission. The electron lenses 170b may form a magnetic field to guide the electrons discharged from the electron gun 170a in a direction. The aperture 170c may adjust the size of the electron beam radiating from each irradiating system 170.

Figure 5A:
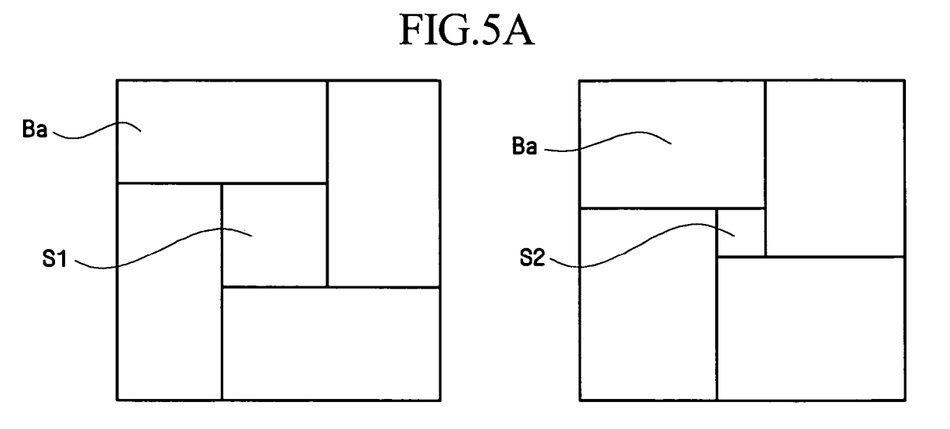
FIGS. 5A and 5B are views illustrating the operation of an aperture of an example embodiment of an E-beam lithography system for adjusting an electron beam.
Figure 5B:
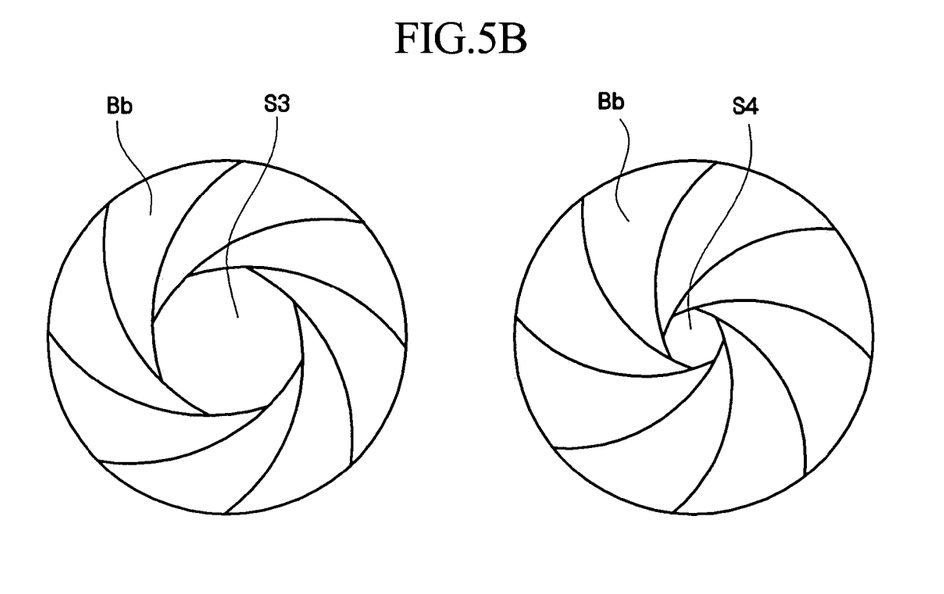

FIGS. 5A and 5B are views illustrating operation of an aperture 170C of an example embodiment of an E-beam lithography system 100. The aperture 170C may adjust an electron beam.

FIG. 5A schematically shows a variable rectangular aperture. Four blinds Ba adjust the size of an opening S1, S2 through which an electron beam passes, thereby adjusting the size of the electron beam. A variable rectangular aperture may be used during an irradiating method using a vector scanning method, for example. In the vector scanning method, the size of an electron beam may be adjusted during an irradiating operation and the stage may not move only in a fixed direction, and instead may move in various directions while radiating the electron beam.

FIG. 5B schematically shows a circular aperture. By rotating a plurality of blinds Bb of the circular aperture, the size of an opening S3, S4 through which an electron beam passes may be adjusted, thereby adjusting the size of the electron beam. The circular aperture may be used during a raster scanning method, for example. In the raster scanning method, an electron beam may not be adjusted in size during an irradiating operation and the stage may be moved only in a desired and/or predetermined direction while radiating the electron beam. While only eight blinds are shown in FIG. 5B, the size of the opening S3, S4 may be adjusted using more blinds Bb according to another example embodiment.

FIGS. 6A to 8B are views illustrating an example operation of adjusting an electron beam using an E-beam measuring unit 180 of an example embodiment of an E-beam lithography system 100. The E-beam measuring unit 180 may perform a measuring operation using a laser or an electron beam. An example of an E-beam measuring unit using a laser is described below. However, an electron beam may be substituted for the laser in the following description.

Figure 6A:
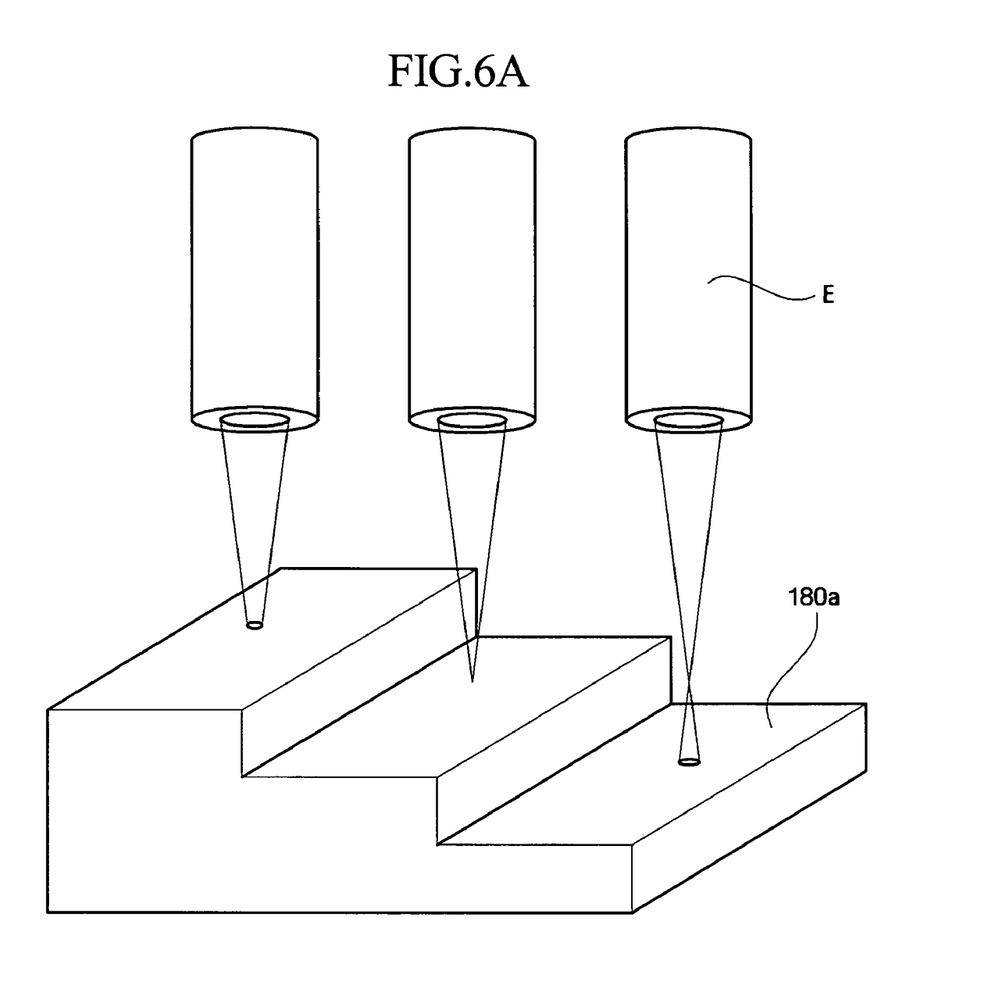
Figure 6B:
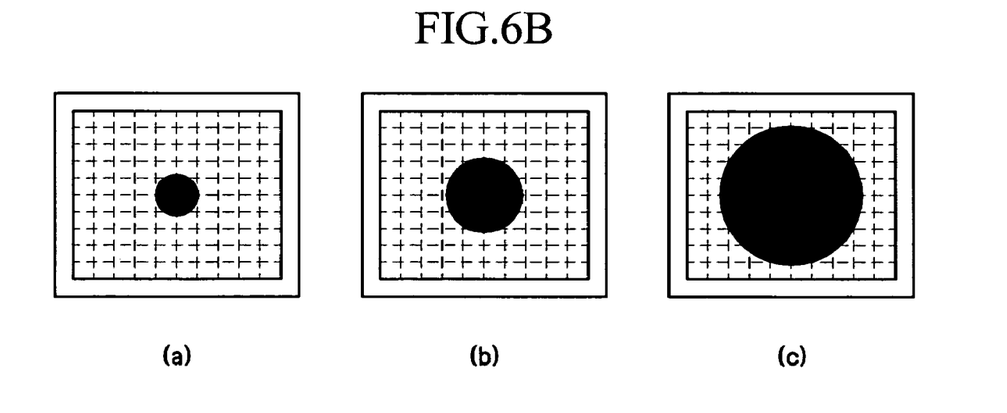

FIGS. 6A and 6B are views illustrating an example operation of measuring a focus distance between the irradiating systems 170 and the stage 160 using the focus measuring part 180a.

For example, a laser reflected after being radiated onto the multilayered stages of the focus measuring part 180a may be received and profiles may be obtained based on the received laser as shown in FIG. 6B. FIG. 6B shows example profiles obtained by reversing the intensity of the received laser. Because the magnitude of the beam spot of the reflected laser is changed depending on the focus distance, the height of the irradiating systems 170 and/or the stage 160 may be appropriately adjusted to obtain the magnitude of an appropriate beam spot, thereby adjusting the focus of an electron beam.

Figure 7A:
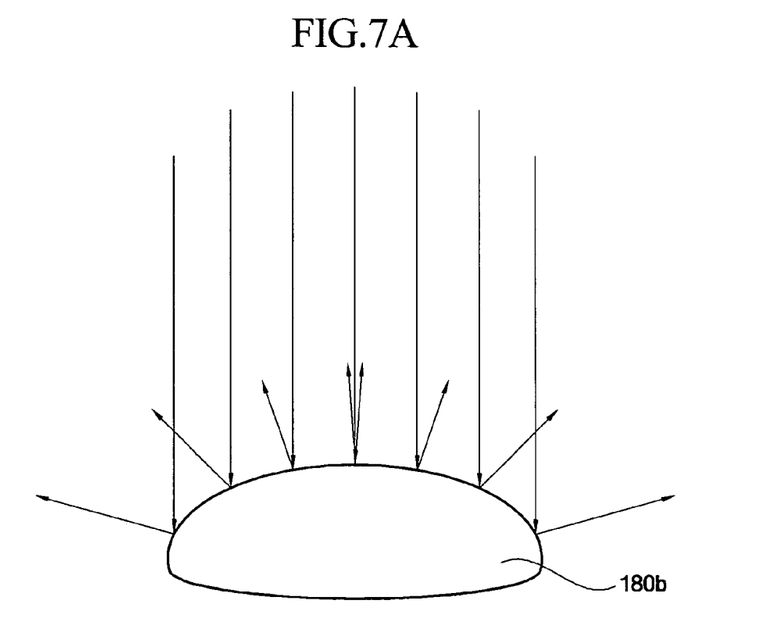
Figure 7B:
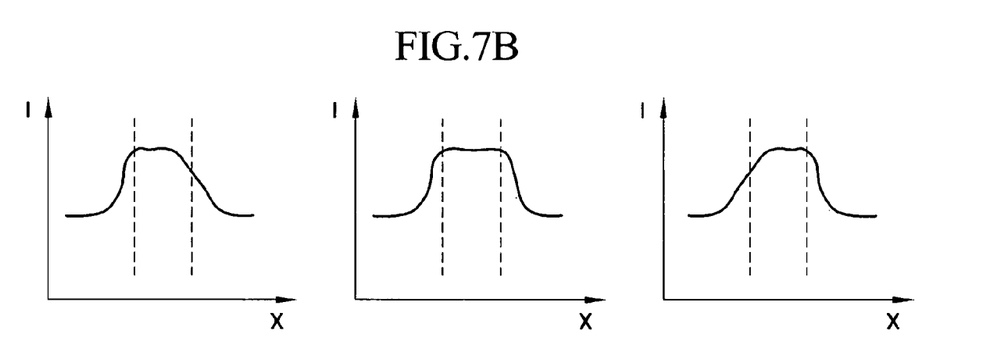

FIGS. 7A and 7B are views illustrating an example operation of adjusting an irradiating angle using a level measuring portion 180b of an example embodiment of an E-beam measuring unit 180.

Particularly, FIG. 7B shows example profiles of a laser that is radiated onto the surface of the level measuring part 180b having a hemi-spherical shape and thereafter reflected. Because the reflection and the scattering of the reflected laser are changed according to an angle at which the laser enters the hemi-spherical level measuring part 180b, the example profiles illustrated in FIG. 7B may be obtained. Referring to FIG. 7B, the middle profile shown in FIG. 7B shows the reflection and scattering profile when a laser enters in a vertical direction. The left and right profiles of FIG. 7B show the reflection and scattering profiles when lasers enter at desired and/or predetermined angles. By adjusting the vertical angle of each irradiating system 170 and/or adjusting the level of the stage 160, the profiles may form relatively uniform, symmetrical arrangements. FIG. 7B illustrates that the incident angles of the laser may tend to the left and right. However, the incident angles of the laser may also tend to the front and back. Thus, the vertical angle of each irradiating system 170 or the level of the stage 160 may be adjusted using front and rear laser profiles as well as left and right laser profiles according to an example embodiment.

Figure 8A:
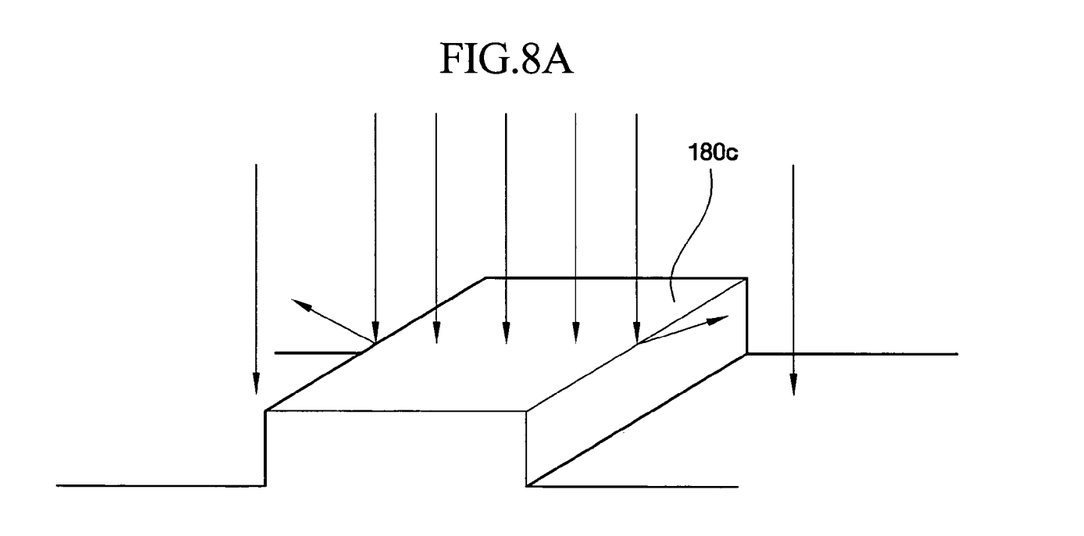
Figure 8B:
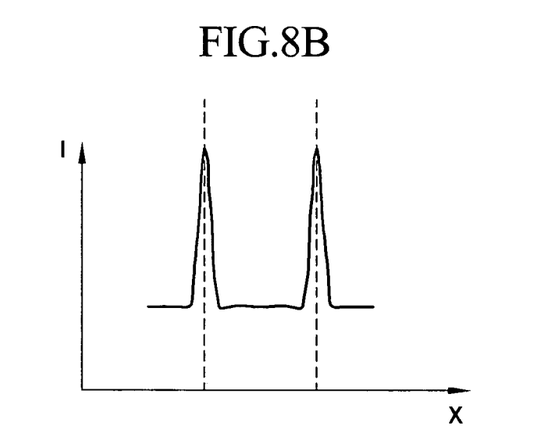

FIGS. 8A and 8B are views illustrating an example operation of adjusting the position of the stage 160 using an example position measuring portion 180c of an example embodiment of an E-beam measuring unit 180.

If the laser, reflected after being radiated onto the position measuring part 180c having the shape of the polygon having the protruding portion or the cross shape, is received, the example profile shown in FIG. 8B may be obtained. Because the radiated laser is not reflected but instead is scattered at edges of the protruding portion of the position measuring part 180c having the polygonal or cross shape, the intensity of the received laser is low as shown in FIG. 8B in which the vertical axis representing intensity is inverted. In FIG. 8B, peaks are formed at the edges of the protruding portion. Accordingly, the stage 160 may be moved such that the peaks correspond to those of a preset profile. Thus, the stage 160 may be correctly positioned. FIG. 8B represents the profile in only the X. However, because the position measuring part 180c has a polygonal and/or cross shape, it is possible to adjust the stage 160 in both X and Y directions.

Figure 9:
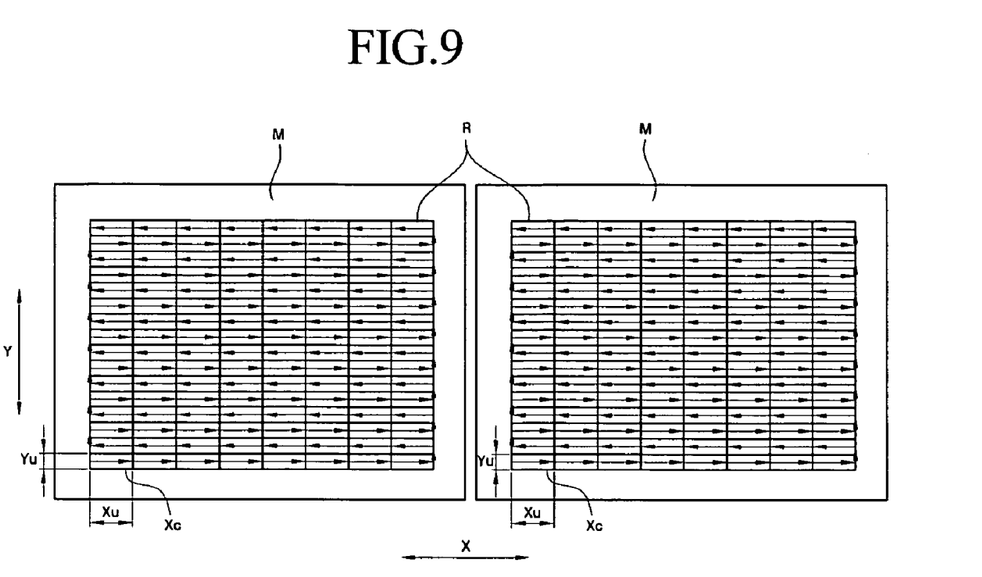
FIG. 9 is a view illustrating an example embodiment of a method of synchronously radiating the electron beam on the surfaces of a plurality of photomasks.

FIG. 9 is a view illustrating an example embodiment of a method of radiating electron beams onto one or more surfaces of a plurality of photomasks M using an E-beam lithography system 100, for example.

As shown in FIG. 9, an area R onto which an electron beam is to be radiated may be divided into a plurality of unit cells Xc. The electron beam may be radiated in stages, and each unit cell Xc may have the shape of a block having a unit distance Xu in the X direction and a unit distance Yu in the Y direction.

The unit distance Xu in the X direction may be varied according to the performance of the E-beam lithography system 100 and/or the pattern data to be radiated. Particularly, the unit distance Xu may depend on the data processing capability of a processor of the E-beam lithography system 100, the capacity of memory, and/or the durability of hardware. Further, the unit distance Xu may depend on the compactness of the pattern to be irradiated using the electron beam, the variety of the shape, and/or the size of the radiated electron beam.

Thus, the unit distance Xu does not refer to the distance based on the hardware, but instead, refers to a distance based on the software. That is, if a pattern to be irradiated is not compact, so that the physical quantity of radiated electron beams is relatively small, or electron beams having a relatively large size are radiated, and/or only a certain shape is radiated, the unit distance Xu may be increased accordingly.

Further, the unit distance Xu may be increased by improving the hardware of the E-beam lithography system 100. That is, if the performance of the processor of the E-beam lithography system 100 is improved, the capacity of the memory is increased, and/or the durability of equipment is improved, the unit distance Xu may be increased.

The unit distance Yu in the Y direction is defined as a width at which electron beams may be radiated in a single scanning operation of each irradiating system 170. While the stage 160 moves from the left side to the right side and vice versa, each irradiating system 170 reciprocates a desired and/or predetermined distance in a direction substantially perpendicular to the moving direction of the stage 160. In this case, the unit distance Yu is the distance reciprocating in one direction. If Yu is increased, the area on which electron beams are radiated at one time is increased, thus improving productivity. However, the E-beam radiating resolution may suffer. Conversely, if the unit distance Yu is reduced, the E-beam radiating resolution is increased but productivity is lowered. Thus, the unit distance Yu should be set to an appropriate value.

In the example shown in FIG. 9, the same pattern may be formed on the left and right photomasks M by radiating electron beams. However, different patterns may be formed on the left and right photomasks M by radiating electron beams according to a different example embodiment.

According to an example embodiment, each irradiating system 170 may include both a variable rectangular aperture and a circular aperture, which may be used to determine the shape of an electron beam. Thus, one irradiating system 170 may radiate an electron beam using the variable rectangular aperture, while another irradiating system 170 may radiate an electron beam using the circular aperture. Of course, the two irradiating systems 170 may radiate electron beams using the same aperture as well.

If the two photomasks M have different patterns, different times may be spent radiating electron beams onto the photomasks M. The time spent radiating an electron beam onto one photomask M may be several times longer than the time spent radiating an electron beam onto the other photomask M. The times spent radiating electron beams onto both the photomasks M may be adjusted accordingly. For example, the time spent radiating the electron beams onto both the photomasks M may be adjusted to be equal to each other.

In an E-beam lithography method according to an example embodiment, the area R onto which electron beams are radiated is divided into unit cells Xc. The electron beams are radiated onto the unit cells Xc in stages, thus making the entire E-beam radiating time constant. Further, to reduce the time spent radiating electron beams, an example embodiment of an irradiating system radiates electron beams while reciprocating in the X direction and moving in the Y direction in stages.

An example embodiment of an E-beam lithography method is described below in stages with reference to FIG. 2.

First, the photomasks M may be loaded onto a loading unit 110 of an example embodiment of an E-beam lithography system 100. A vacuum chamber door 115 connected to the vacuum chamber 120 may be opened, and the first robot arm Ra provided in the loading unit 110 of FIG. 2, for example, may transfer the loaded photomasks M into the vacuum chamber 120. Next, the vacuum chamber door 115 may be closed, and a vacuum pump (not shown) connected to the vacuum chamber 120 may operate to create a vacuum in the vacuum chamber 120.

The vacuum level of the vacuum chamber 120 may be substantially similar to the vacuum levels of the other chambers 130, 140, and 150 shown in FIG. 2.

Thereafter, the transfer chamber door 125 connected to the transfer chamber 140 may be opened, and the second robot arm Rb provided in the transfer chamber 140 may transfer the photomasks M into the alignment chamber 130. Accordingly, the alignment chamber door 135 may be opened.

The photomasks M may be aligned on the cassette 175 in the alignment chamber 130. The step of aligning the photomasks M on the cassette 175 may use one or more of the four corners of the photomasks M, for example.

The internal robot arm Rb may then transfer the photomasks M and/or the cassette 175, which have been aligned, into the lithography chamber 150, and may mount the photomasks M and/or the cassette 175 on the stage 160. The alignment chamber door 135 and the lithography chamber door 145 may be opened at this time. If the photomasks M and/or the cassette 175 have been mounted on the stage 160, the lithography chamber door 145 may be closed. The E-beam control system may adjust the stage 160 and the irradiating systems 170 using the E-beam measuring unit 180 to locate that stage 160 at an initial E-beam radiating position.

The irradiating systems 170 may then begin radiating electron beams onto the surfaces of the photomasks M, which are mounted on the stage 160. The stage 160 may move up, down, left and right. In this case, the stage 160 does not move in only one direction while radiating electron beams, but instead, repeatedly performs the following while radiating electron beams.

For example, as shown by the arrows in FIG. 9, the stage 160 moves in one X direction while being fixed in the Y direction. In such a state, electron beams are radiated. Next, the stage 160 moves by one unit distance in a Y direction while being fixed in the X direction. At this time, electron beams are not radiated. Then, the stage 160 moves in an X direction opposite that of the first step while being fixed in the Y direction and electron beams are radiated. Next, the stage 160 moves by a unit distance in the same Y direction while being fixed in the X direction. Electron beams are not radiated during the movement in the Y direction. These processes may be repeated.

According to the example described above, the unit distance Yu moved in the Y direction may be kept constant; electron beams may be radiated onto a plurality of unit cells Xc in stages; and whenever the process of radiating an electron beam onto each unit cell Xc is completed, the E-beam radiating state of the irradiating systems 170 and/or the position of the stage 160 may be checked using the E-beam control system.

In addition, the scope of the above example embodiments may be applied to a wafer manufacturing process for manufacturing a semiconductor device as well as a photomask.

If applied to a wafer manufacturing process, a chuck for mounting a wafer and/or a wafer stage may be substituted for the cassette 175 and/or the stage 160. More chucks and/or stages may be desired and/or needed to perform a wafer manufacturing process. Further, a machining cassette suitable for the shape of a wafer may be separately manufactured and applied.

Further, according to the number of wafers to be manufactured simultaneously, a plurality of irradiating systems 170, E-beam control systems and E-beam measuring units 180 may be provided. The positions of the components may be variously changed. For example, a plurality of irradiating systems 170 may be arranged side by side or in a lattice form. According to the arrangement of the irradiating systems 170, a plurality of E-beam measuring units 180 may be provided at various positions. As necessary, the E-beam control system may include a plurality of E-beam control systems.

Although example embodiments have been described above for illustrative purposes, those skilled in the art will appreciate that various modifications, additions and/or substitutions are possible, without departing from the scope and spirit of the example embodiments.

What is claimed is:

1. An E-beam lithography system, comprising:
   a loading unit loading and unloading substrates;
   an alignment chamber in which the substrates are aligned; and
   a lithography chamber including a stage where more than one of the substrates are mounted and irradiated with at least one electron beam;
   wherein the stage includes an E-beam measuring unit adjusting the at least one electron beam and aligning the stage,
   wherein the E-beam measuring unit includes a focus measuring portion, a level measuring portion, and a position measuring portion,
   wherein the focus measuring portion has multiple levels, wherein the level measuring portion has one of a shape of a polygon with a convex surface and a shape of a hemisphere, and wherein the position measuring portion has one of a shape of a polygon with a protruding portion and a cross shape.

2. The E-beam lithography system of claim 1, further comprising:

a vacuum chamber creating a vacuum in the chambers; and a transfer chamber transferring the substrates from at least one of the loading unit and the chambers.

3. The E-beam lithography system of claim 1, wherein the E-beam measuring unit is located at a center of the stage.

4. The E-beam lithography system of claim 1, wherein the stage includes:

a first direction stage moving portion moving the stage in a first direction; and a second direction stage moving portion moving the stage in a second direction.

5. The E-beam lithography system of claim 4, wherein the first direction is substantially perpendicular to the second direction.

6. The E-beam lithography system of claim 4, wherein the stage includes a first direction stage guide and a second direction stage guide.

7. The E-beam lithography system of claim 4, wherein the stage includes a first direction laser mirror and a second direction laser mirror.

8. The E-beam lithography system of claim 1, wherein a plurality of irradiating systems is provided in the lithography chamber.

9. The E-beam lithography system of claim 8, wherein each of the irradiating systems includes an electron gun, at least one electron lens, and at least one aperture.

10. The E-beam lithography system of claim 9, wherein the at least one aperture includes at least one of a variable rectangular aperture and a circular aperture.

11. The E-beam lithography system of claim 8, wherein the irradiating systems share one E-beam control system controlling density, current, voltage and energy of the at least one electron beam.

12. The E-beam lithography system of claim 1, wherein the alignment chamber includes a cassette aligning the substrates.

13. The E-beam lithography system of claim 1, wherein each of the substrates is one of a photomask and a reticle.

* * * * *